United States Patent

Woo et al.

[11] Patent Number: 5,429,961
[45] Date of Patent: Jul. 4, 1995

[54] METHOD FOR MANUFACTURING A THIN FILM TRANSISTOR

[75] Inventors: Sang H. Woo, Kyoungki-do; Ha E. Jeon, Seoul, both of Rep. of Korea

[73] Assignee: Hyundai Electronics Industries Co. Ltd., Kyoungki-do, Rep. of Korea

[21] Appl. No.: 127,968

[22] Filed: Sep. 28, 1993

[30] Foreign Application Priority Data

Sep. 29, 1992 [KR] Rep. of Korea ............... 92-17795

[51] Int. Cl.⁶ ............................................. H01L 21/86
[52] U.S. Cl. .................................. 437/40; 437/247; 437/967; 148/DIG. 3; 148/DIG. 122
[58] Field of Search ............ 437/40, 247, 109, 913, 437/101, 967; 148/DIG. 1, DIG. 3, DIG. 122

[56] References Cited

U.S. PATENT DOCUMENTS

| | | | |
|---|---|---|---|
| 4,358,326 | 11/1982 | Doo | 437/247 |
| 4,597,160 | 7/1986 | Ipri | 437/41 |
| 4,814,292 | 3/1989 | Sasaki et al. | 437/247 |
| 4,897,360 | 1/1990 | Guckel et al. | 437/109 |
| 5,147,826 | 9/1992 | Liu et al. | 437/973 |
| 5,180,690 | 1/1993 | Czubatyj et al. | 437/109 |
| 5,242,855 | 9/1993 | Oguro | 437/967 |
| 5,266,504 | 11/1993 | Blouse et al. | 437/109 |

FOREIGN PATENT DOCUMENTS

| | | | |
|---|---|---|---|
| 2148831 | 6/1990 | Japan | 437/967 |
| 4321219 | 11/1992 | Japan | 437/967 |

*Primary Examiner*—Brian E. Hearn
*Assistant Examiner*—Michael Trinh
*Attorney, Agent, or Firm*—Popham, Haik, Schnobrich & Kaufman, Ltd.

[57] ABSTRACT

A method for manufacturing a TFT of a SRAM in a highly-integrated semiconductor device, to enlarge the grain size of a polysilicon film, includes steps of depositing amorphous silicon film under a pressure capable of maintaining a uniform thickness thereof, and forming a polysilicon film which has a maximized grain size in the same tube that the amorphous silicon film has been deposited, while performing an annealing process by raising the temperature to 600°–650° C. for 4–10 hours under the pressure which is lowered to approximately $10^{-3}$ Torr. The polysilicon film having a maximized grain size is utilized as the channels of the TFT.

1 Claim, 1 Drawing Sheet

METHOD FOR MANUFACTURING A THIN FILM TRANSISTOR

BACKGROUND OF THE INVENTION

The present invention relates to a method for manufacturing a channel polysilicon film of a thin film transistor (hereinafter referred to as "TFT") for a static random access memory (SRAM) in a highly integrated semiconductor device, and more particularly to a method for enlarging the grain size of a channel polysilicon film of a TFT.

In order to meet requirements of high-speed operation and low power dissipation accompanied with contriving high packing density in SRAM devices, research & development on PMOS TFT-type load cells has been rapidly carried out. This is because the PMOS TFT-type load cell has advantages of maintaining low stand-by current and stabilizing data maintenance, which are most important characteristics in the SRAM devices.

In such a PMOS TFT-type load cell, however, the channel of the PMOS is formed in a polysilicon film rather than in a single-crystal silicon film. Therefore, the PMOS TFT-type load cell inherently has drawbacks of low carrier mobility caused by a grain boundary potential barrier, thermal emission of carriers trapped by the grain boundary and leakage current produced by field emission, as well as a complicated process in manufacturing.

Accordingly, in order to solve the problems of low carrier mobility and leakage current caused by the grain boundary of the channel polysilicon film in a TFT technology, a method for minimizing the length of the grain boundary of the channel polysilicon film, i.e., a method for maximizing the grain size, has been suggested.

For this purpose, in a conventional technique, a channel of the TFT is formed such that an amorphous silicon film is deposited at a low temperature via a low pressure (LP) or plasma-enhanced chemical vapor deposition (PECVD) method, and an annealing is performed for polycrystalization under an inert nitrogen gas ($N_2$) ambient at a relatively low temperature range of 600°–650° C. for long hours, thereby maximizing the grain size.

However, according to the above-stated method, the deposited amorphous silicon film is inevitably exposed to the atmosphere when it is transported to another tube, and the annealing for polycrystalization is carried out in another tube. Moreover, since the grain size of the finally-formed channel polysilicon film is smaller than 0.3 μm, $I_{on}/I_{off}$ current ratio among the channel characteristics of the TFT is low.

SUMMARY OF THE INVENTION

Therefore, to solve the above-described problems of the present invention, an object of the present invention is to province a method for manufacturing a TFT capable of lowering a trap level per unit area of a channel polysilicon film by enlarging a grain size of the polysilicon film.

To achieve the above object of the present invention, an amorphous silicon film is deposited at a temperature of 510°–550° C. under a pressure capable of uniformly maintaining the film thickness to decrease the number of seeds which exert an influence upon a polysilicon growth during annealing. After depositing the amorphous silicon film, the annealing is performed for 4–10 hours while raising the temperature to 600°–650° C. and lowering the pressure to $10^{-3}$ torr within a tube which has also been utilized for deposition.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENT

Figure 1:
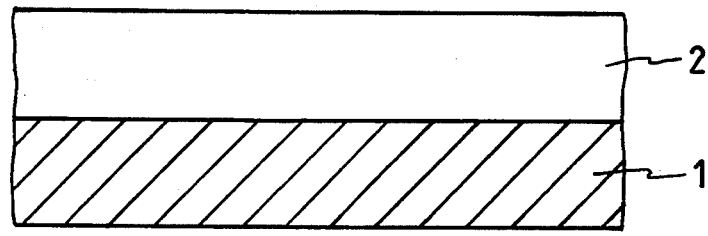
FIGS. 1 to 3 are sectional views for showing a process of manufacturing a channel polysilicon film of a TFT according to the present invention.

Referring to FIG. 1, an amorphous silicon film 2 is formed on an oxide layer 1, using a silane gas ($SiH_4$) at a temperature of 510°–550° C. At this time, by accelerating the depositing speed under a pressure of approximately 1 torr which can maintain the uniform thickness of the amorphous silicon film 2, the possible formation of the seeds critically affecting the grain size is minimized.

Figure 2:
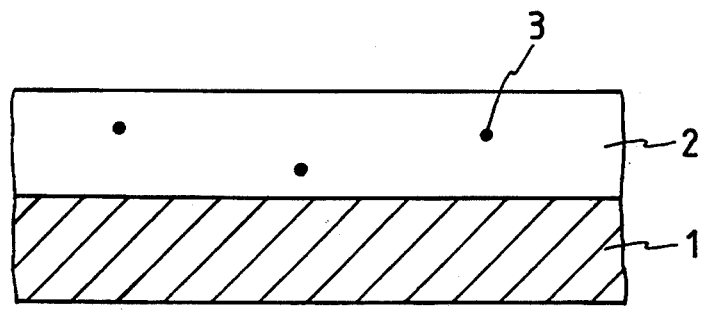

Referring to FIG. 2, a minority of seeds 3 are formed in the amorphous silicon film 2, while the annealing is performed for 4–10 hours or so by raising the temperature to 600°–650° C. and lowering the pressure to roughly $10^{-3}$ Torr, under the state that the amorphous silicon film 2 is placed within the same tube without being changed.

Figure 3:
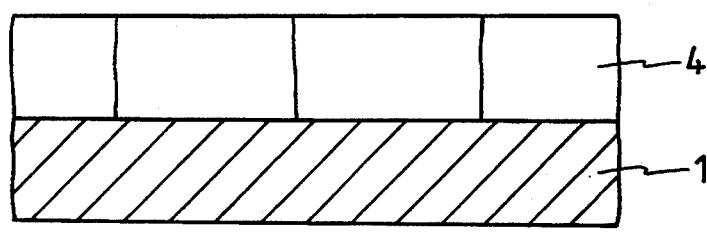

Referring to FIG. 3, a polysilicon film 4 whose grain size becomes maximized by allowing the seeds 3 to be grown during the annealing process.

An experiment shows that the channel polysilicon film 4 of the TFT according to the present invention has an $I_{on}/I_{off}$ current ratio improved by 1.5 times as compared with that of the conventional polysilicon film.

When the polysilicon film grown according to the present invention is employed as the channel polysilicon film of TFTs, the characteristic of the TFT is improved. In addition to this improvement, since the deposition and long-time low temperature annealing of the amorphous silicon film are carried out in a single tube, the present invention is effective in productivity. Furthermore, the annealing is performed under a vacuum state after depositing the amorphous silicon film, thereby maximizing the grain size of the polysilicon film.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for manufacturing a channel polysilicon film of a thin film transistor, said method comprising the steps of:

depositing an amorphous silicon film on a lower material layer at a temperature of 510°–550° C., using a silane gas ($SiH_4$) under a pressure of about 1 torr which can maintain a uniform thickness thereof; and forming a polysilicon film having a maximized grain size in a tube on which said amorphous silicon film has been deposited, while performing an annealing process at a temperature of 600°–650° C. for a time of 4–10 hours under a pressure lowered to approximately $10^{-3}$ torr.

* * * * *